(12) United States Patent
Poirier et al.

(10) Patent No.: US 6,281,710 B1
(45) Date of Patent: Aug. 28, 2001

(54) SELECTIVE LATCH FOR A DOMINO LOGIC GATE

(75) Inventors: Christopher Allan Poirier; Samuel D Naffziger, both of Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/465,919

(22) Filed: Dec. 17, 1999

(51) Int. Cl.$^7$ .................................................. H03K 19/00
(52) U.S. Cl. .................................................. 326/93; 326/98
(58) Field of Search .................... 326/95, 93, 98, 326/56, 57, 58

(56) References Cited

U.S. PATENT DOCUMENTS

| | | | |
|---|---|---|---|
| 5,453,708 | * 9/1995 | Gupta et al. ............................. | 326/98 |
| 6,075,386 | * 6/2000 | Naffziger ................................ | 326/98 |
| 6,166,564 | * 12/2000 | Rosen ..................................... | 326/93 |

* cited by examiner

Primary Examiner—Michael Tokar
Assistant Examiner—Anh Q. Tran (57) ABSTRACT

An integrated circuit chip includes a domino logic gate, circuitry for selectively latching a logic output signal of the gate and an enable source for the gate. The enable source and gate positions on the chip and a clock driving the chip has a frequency such that the enable signal arrives late at the logic gate during the evaluate phase of each clock cycle. The circuitry for selectively latching is constructed so that the domino logic gate is evaluated or latched during the same clock cycle that the enable signal is derived despite the aforementioned positions and frequency.

13 Claims, 5 Drawing Sheets

EDLC Operation with enable false:

Fig. 4B

EDLC Operation with enable true:

Fig. 5

SELECTIVE LATCH FOR A DOMINO LOGIC GATE

TECHNICAL FIELD

The present invention relates generally to complementary metal oxide semiconductor (CMOS) integrated circuitry and more particularly to such circuitry including a domino logic gate that is selectively latched and which can be evaluated late in an evaluation phase of a clock cycle.

BACKGROUND ART

Figure 1:
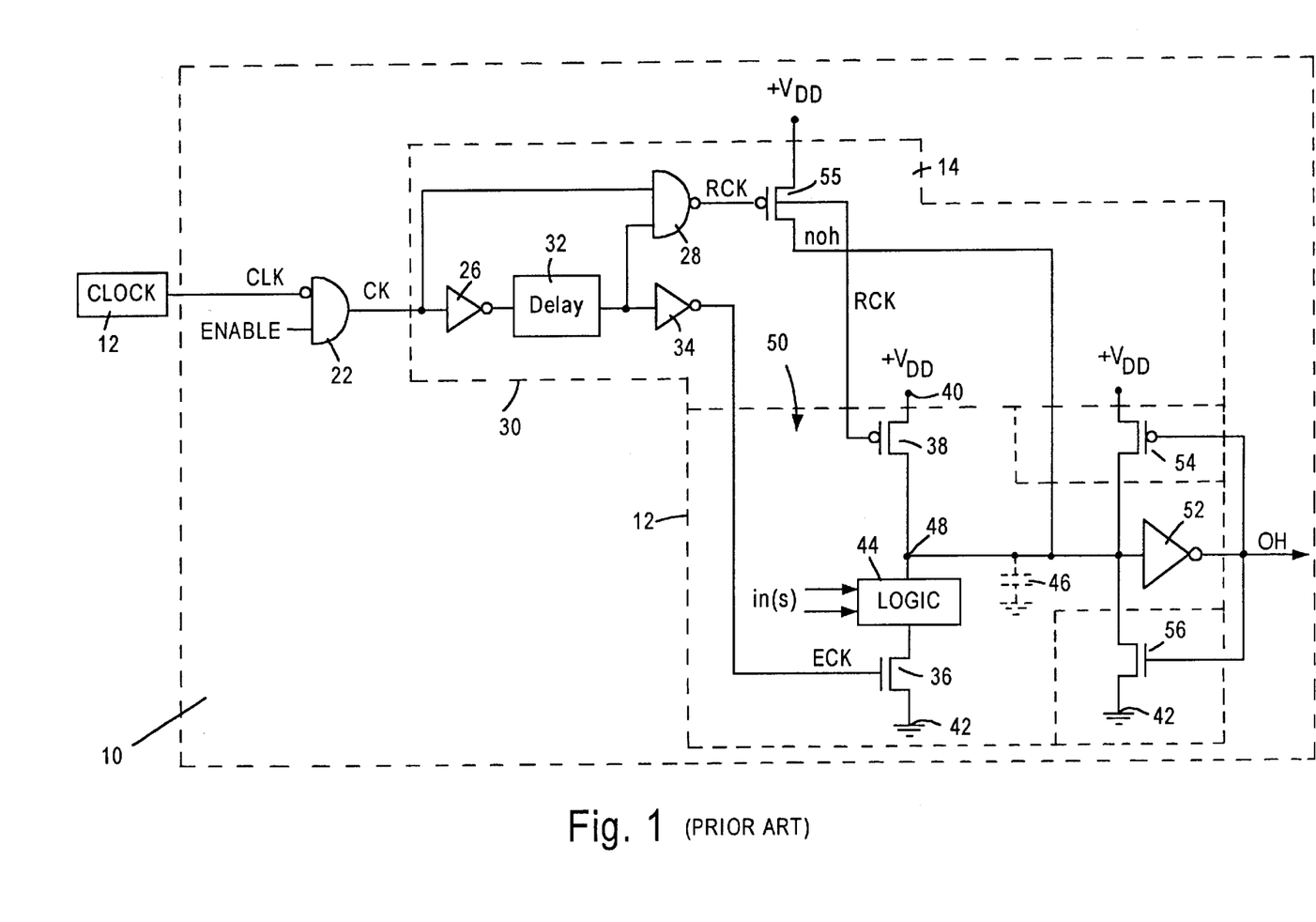
FIG. 1 is a circuit diagram of a prior art integrated circuit including a domino logic gate and a circuit for selectively latching the domino logic gate.

FIG. 1 is a circuit diagram of a prior art integrated circuit (IC) including a CMOS domino logic gate in combination with circuitry for selectively latching the gate. The circuit of FIG. 1 includes complementary field effect transistors (FET) carried by integrated circuit chip 10 responsive to a clock source 12 having a high frequency such as 500 MHz. Source 12 derives a substantially rectangular clock wave (CLK) 14 (FIG. 2) having a high, positive voltage (i.e., binary one) precharge phase 16 and a low, ground voltage (i.e., binary zero) evaluate phase 18 during each cycle of the clock wave, such that portion 16 has a longer duration than portion 18.

The clock wave from source 12 and an enable signal 20 from a source (not shown) on chip 10 are combined in AND gate 22 having an inverter input responsive to CLK. Gate 22, when enabled by a positive voltage from the enable source, responds to CLK to derive CK wave 24 having a positive voltage duration equal to the ground voltage or binary zero portion 18 of wave 14, FIG. 2. The positive going transition of CK wave 24 occurs somewhat after the negative going transition of wave of 14, at a time determined by the inherent delay time of gate 22.

The CK output signal of gate 22 is applied in parallel to inverter 26 and a first input terminal of NAND gate 28, both included in selective latching circuit 30. The output signal of inverter 26 is supplied to a second input terminal of gate 28 by delay circuit 32. Circuits 26, 28 and 32 are such that a RCK reset clock output wave 33 of gate 28 has a negative going transition substantially simultaneously with the positive going transition of CK. RCK has a positive going transition that occurs a short time after the negative going transition thereof, at a time determined by the delay time of circuit 32. The positive going transition of RCK occurs considerably before the negative going transition of CK which follows the positive going transition of CK which caused the negative going transition of RCK.

The output signal of delay circuit 32 is applied to inverter 34 which derives an ECK enable clock wave 35, having a positive going transition that occurs substantially simultaneously with the positive going transition of RCK wave 33. ECK wave 35 has a negative going transition that is delayed from its positive going transition by a duration equal to the time between the negative and positive going transitions of CLK wave 14. Inverter 34 supplies ECK wave 35 to the gate electrode of N-channel field effect transistor 36, having a grounded source. Transistor 36 and P-channel field effect transistor 38 have source drain paths thereof connected in series between $V_{DD}$ positive power supply terminal or rail 40 and ground terminal or rail 42. Logic circuit 44, responsive to plural binary logic signals in(s), (indicated by wave 45) has a pair of output terminals connected between the drain of transistor 36 and the drain of transistor 38. A parasitic capacitance 46, shown connected to terminal 48 at the drain of transistor 38, shunts logic circuit 44 and the drain source path of transistor 36. Transistors 36 and 38, logic circuit 44 and parasitic capacitance 46 form part of domino logic gate 50, which also includes inverter 52. Inverter 52 has an input terminal connected to be responsive to the voltage level at terminal 48 to derive output signal OH.

The RCK output wave 33 of gate 28 drives the gate of P-channel field effect transistor 55, having its source drain path connected between $+V_{DD}$ terminal 40 and terminal 48, at the input of inverter 52. Transistor 55, when switched on by a low, binary zero value of RCK wave 33, supplies current to parasitic capacitance 46 and the input terminal of inverter 52. A low, binary zero value of RCK output wave 33 of gate 28 turns on transistor 38 to precharge capacitance 46 substantially to the $+V_{DD}$ voltage at power supply terminal 40. Simultaneously, transistor 55 supplies a positive voltage to the input of inverter 52 so the inverter derives a low, binary zero output signal. Subsequently, the high value of ECK wave 35 forward biases the drain source path of transistor 36. If the logic function of logic gate 44 is satisfied by the input signals of the logic gate, there is a low impedance between the logic gate output terminals, resulting in a low impedance discharge path for capacitance 46 through the drain source path of transistor 36, to reduce the voltage at terminal 48 substantially to ground. Inverter 52 responds to the low voltage at terminal 48 to derive a positive, binary one level to indicate the logic function of gate 44 has been satisfied. The logic function of gate 44 must be satisfied while ECK wave 35 has a high value, i.e., sometime during the evaluate interval 18 of CLK wave 14 or early in the precharge interval 16 immediately following evaluate interval 18.

P-channel transistors 54 and N-channel transistor 56, having the source drain paths thereof connected in series between the positive power supply terminal 40 and ground, latch the output signal of inverter 52. The OH output signal of inverter 52 drives the gates of transistors 54 and 56 in parallel. Hence, for example, if the input signal of inverter 52 is a low voltage, causing the inverter output signal to be a high voltage, the inverter high voltage output forward biases transistor 56 to latch the inverter input to ground and its output to $+V_{DD}$. In contrast, if the input signal of inverter 52 is a high voltage, the inverter output signal is a low voltage that forward biases transistor 54 to latch the inverter input to a high voltage and its output to a low voltage.

If an enable signal is not derived during a particular CLK cycle, the input and output of inverter 52 remain latched at the value they had during the previous CLK cycle when an enable signal was derived. In such a situation, gate 22 derives a low binary zero value throughout the CLK cycle. Consequently, RCK and ECK respectively remain at the high and low voltage levels through the CLK cycle. As a result, capacitance 46 maintains its charge throughout the CLK cycle and no low impedance path can be established through transistor 36 to enable the logic function of gate 44 to be evaluated. Similarly, transistors 55 and 38 remain off and cannot supply charge to capacitance 46.

As previously discussed, the enable signal must be derived relatively early (before CLK falls) during a CLK cycle in order for the circuit of FIG. 1 to function properly. However, there are certain instances when it is not possible to provide the enable signal relatively early during the CLK cycle. As integrated circuit chips increase in size and the clock frequencies driving the integrated circuits increase, enable signals from different regions of an integrated circuit chip remote from a domino logic gate and a latch circuit associated with the domino logic gate have a tendency to arrive at the domino logic gate late in a CLK cycle (i.e., during the CLK low phase). The circuit of FIG. 1 is unable to handle such a situation which can occur, e.g., for chips having 2 cm edges and 500 MHz clock frequencies.

It is, accordingly, an object of the present invention to provide a new and improved circuit for selectively latching a domino logic gate of an integrated circuit chip.

Another object of the invention is to provide a new and improved circuit for selectively latching a domino logic gate on a relatively large integrated circuit chip responsive to a relatively high clock frequency, wherein an enable signal for overcoming latching can arrive at circuitry associated with the domino logic gate relatively late in a clock cycle.

An additional object of the invention is to provide a new and improved circuit for selectively latching a domino logic gate on a relatively large integrated circuit chip responsive to a relatively high clock frequency, wherein an enable signal for overcoming latching can be derived from circuitry on the chip that is relatively remote from circuitry associated with the domino logic gate.

SUMMARY OF THE INVENTION

In accordance with one aspect of the invention an integrated circuit chip responsive to a clock source includes a domino logic gate, circuitry for selectively latching a logic output signal of the gate, and an enable source for the gate. The enable source and gate positions and the clock frequency are such that the enable signal arrives at the logic gate late in an evaluate phase of each clock cycle. The circuitry for selectively latching is constructed so that the domino logic gate is evaluated or latched during the same clock phase that the enable signal is derived.

In accordance with another aspect of the present invention an integrated circuit chip adapted to be responsive to a clock wave source comprises: (1) a domino logic gate located on a first segment of the chip and including precharge and evaluate circuitry; (2) circuitry for selectively latching a logic output signal of the domino logic gate and for selectively enabling precharge and evaluate circuitry of the domino logic gate to operate in a normal mode so that the domino logic gate is precharged early in the evaluate phase of the clock wave and an output signal of the domino logic gate is evaluated later in the evaluate phase of the clock wave, wherein the circuitry for selectively latching and enabling is on the first segment of the chip; and (3) an enable source for commanding normal operation of the domino logic gate. The enable source is on a second segment of the chip, at a location relative to the first segment such that the signal from the enable source arrives at the first segment of the chip after the precharge phase of the clock wave has elapsed. The circuitry for selectively latching and enabling responds to the clock wave and the enable signal for causing: (1) the domino logic circuit to operate normally when the enable signal has a value associated with enabling the circuit for selectively latching and enabling during a clock wave cycle; and (2) the domino logic circuit output signal to be restored and latched to the value it had last cycle once the first portion of the clock signal evaluate phase has elapsed when the enable signal has a value associated with disabling the circuitry for selectively latching and enabling during a clock wave cycle.

In a preferred embodiment the circuitry for selectively latching and enabling includes logic circuitry responsive to a delayed replica of the clock wave as supplied to the first segment of the chip and the enable signal as supplied to the first segment. The logic circuitry derives an evaluate signal during the evaluate phase of the clock cycle and supplies the derived evaluate signal to the domino logic gate after the first portion of the clock cycle evaluation phase has elapsed.

In a preferred embodiment the enable signal includes first and second components. The first component has a first binary value associated with enabling the circuitry for selectively latching and enabling the domino logic gate. The second component has a first binary value associated with disabling the circuitry for selectively latching and enabling the domino logic gate. The circuitry for selectively latching and enabling includes logic circuitry. The logic circuitry responds to the first binary value of the first enable component and the clock wave to enable the evaluate circuitry during the clock evaluation phase and thereafter latches the output signal of the domino gate to the signal value which resulted from the evaluation. The logic circuitry also responds to the first binary value of the second enable component, the output signal of the domino logic circuit and the clock wave to latch the domino logic circuit output signal and prevent evaluation stage operation of the domino logic circuit.

The logic circuit preferably includes a switch and delay circuitry responsive to the clock wave for deriving a reset (RCK) wave having a first binary value during the first portion of the clock evaluation phase. The first binary value of the reset wave allows precharging of the domino logic circuitry during the first portion of the clock evaluation phase. The switch is connected in shunt with a capacitance of the domino logic circuit that is precharged during the first portion of the evaluation phase and is selectively discharged during the second portion of the evaluation phase. The switch discharges the capacitance while (1) the reset wave has a second binary value, (2) the second enable component has the first binary value and (3) the domino logic circuit output previously had a first predetermined value for a period including the most recent precharge interval and at least one of the most recent evaluate intervals and the period between them. The switch is open while (1) the reset wave has the first binary value or (2) the second enable component has a second binary value, or (3) the domino logic circuit output previously had a second predetermined value for the period including the most recent precharge interval and at least one of the most recent evaluate intervals and the period between them. The capacitance is connected to an input of an inverter which drives the domino logic circuit output. Latching circuitry couples the output of the inverter back to the input of the inverter.

Preferably, a portion of the logic circuitry includes a pass gate connected to be responsive to the domino gate output. The pass gate is responsive to the clock wave as coupled to the first segment of the chip for coupling the domino gate output to a terminal during the precharge phase of the clock. A regenerative latching circuit connected to the terminal maintains the voltage at the terminal substantially constant during the evaluate phase of the clock. This arrangement enables transfer of the domino circuitry output value at the end of the evaluation phase to this latch (during the precharge phase of the clock). The latch stores the transferred domino circuitry output value at the end of the evaluation phase for use with the switch mechanism during the evaluate clock phase in the next cycle. The switch is connected to be responsive to the voltage at this terminal.

The switch preferably includes first, second and third field effect transistors of the same first conductivity type having source drain paths series connected between a power supply terminal and an input terminal of an inverter of the domino logic gate. The first, second and third transistors have gate electrodes respectively responsive to (1) the voltage at the domino logic gate output terminal from the previous cycle, (2) a shaped version of the clock wave causing cut off of the gate of the second transistor during the first portion of the evaluation phase, and (3) the enable wave second component. A fourth field effect transistor of a second conductivity type opposite to the first conductivity type has a source drain path connected between a high voltage DC power supply terminal of the chip and a terminal between the source drain paths of the second and third transistors. The fourth transistor has a gate electrode connected to be responsive to the shaped version of the clock wave so that the fourth transistor supplies current to a terminal between the source drain paths of the second and third transistors during the first portion of the clock evaluation phase to prevent establishment of a charge share path for the capacitance through the third transistor during the later portion of the clock evaluation phase.

The above and still further objects, features and advantages of the present invention will become apparent upon consideration of the following detailed description of a specific embodiment thereof, especially when taken in conjunction with the accompanying drawings.

BRIEF DESCRIPTION OF DRAWINGS

As described.

DESCRIPTION OF THE PREFERRED EMBODIMENT

Figure 3:
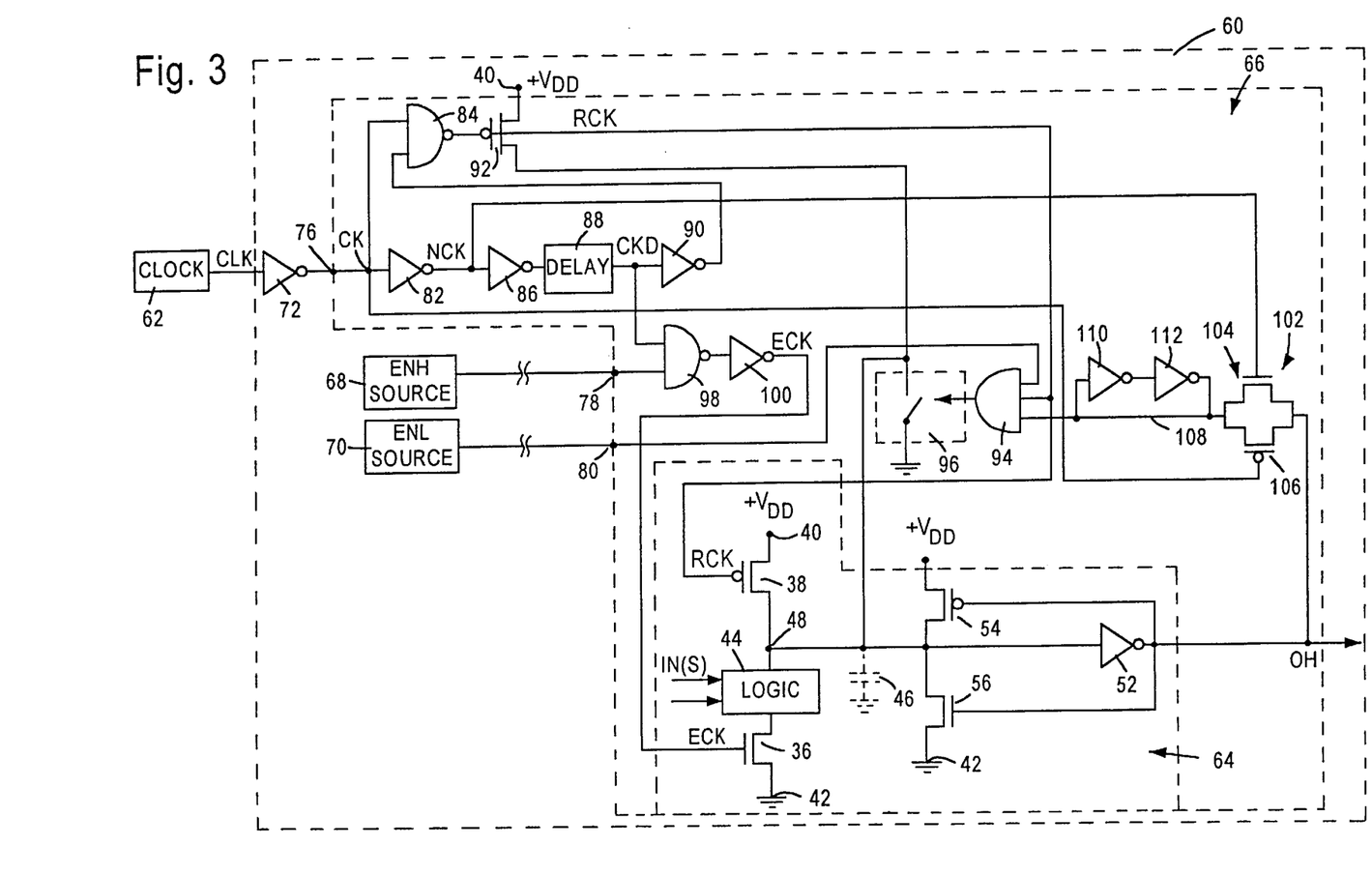
FIG. 3 is a circuit diagram of an integrated circuit including a domino logic gate and a circuit for selectively latching the domino logic gate in accordance with a preferred embodiment of the present invention.

The CMOS circuitry on integrated circuit chip 60, FIG. 3, is responsive to clock wave CLK from clock source 62, which has the same characteristics as clock source 12, FIG. 1. The circuitry on chip 60 includes domino logic gate 64 and converter circuit 66 which selectively latches the domino logic circuit in response to signals from enable sources 68 and 70. Domino logic gate 64 and converter circuit 66 are in close proximity to each other on chip 60, while sources 68 and 70 are remote from gate 64 and circuit 66, as is clock source 62.

Sources 68 and 70 respectively derive enable signals ENH and ENL having binary one, positive voltage levels which respectively indicate domino logic gate 64 is to be responsive to a logic function and is not to be responsive to the logic function during a particular cycle of clock source 62. Hence, ENH and ENL can respectively be considered as first and second components of an enable signal. Because of (1) the physical spacing between sources 68 and 70 and the circuitry included in domino logic gate 64 and converter 66, (2) the physical spacing of inverter 72 and the point on chip 60 where the clock wave is supplied to the chip relative to the circuitry in gates 64 and converter 66, and (3) the frequency of the clock wave, the binary one levels from sources 68 and 70 arrive at gate 64 and circuit 66 relatively late in (1) the low voltage evaluation phase of the CLK wave source 62, and (2) the high voltage evaluation phase of the CK wave, as coupled to terminal 76. Converter circuit 66 is arranged so that domino logic gate 64 can respond to the signal from source 68 and derive an output signal in accordance with the logic function of logic gate 44, even though the signal from source 68 arrives at circuit 66 at these relatively late times in the clock cycle. In other words, in the circuit of FIG. 3, inverter 52 can respond to the input signals of logic circuit 44 satisfying the logic condition of the logic circuit late in the low voltage evaluation phase of the CLK wave. A binary one signal from enable source 70 during a particular clock cycle causes the output signal of domino logic gate 64 to be restored to the value it had in the previous cycle. The action of sources 68 and 70 is frequently referred to in the art as "mouse trap."

Domino logic gate 64 is identical to domino logic gate 50, FIG. 1, so the same reference numerals are used for the circuit elements of gate 64 as are employed in gate 50. The operation of domino logic gate 64 in response to the reset and enable clocks RCK and ECK is identical to that described above with regard to FIG. 1.

Figure 4A:
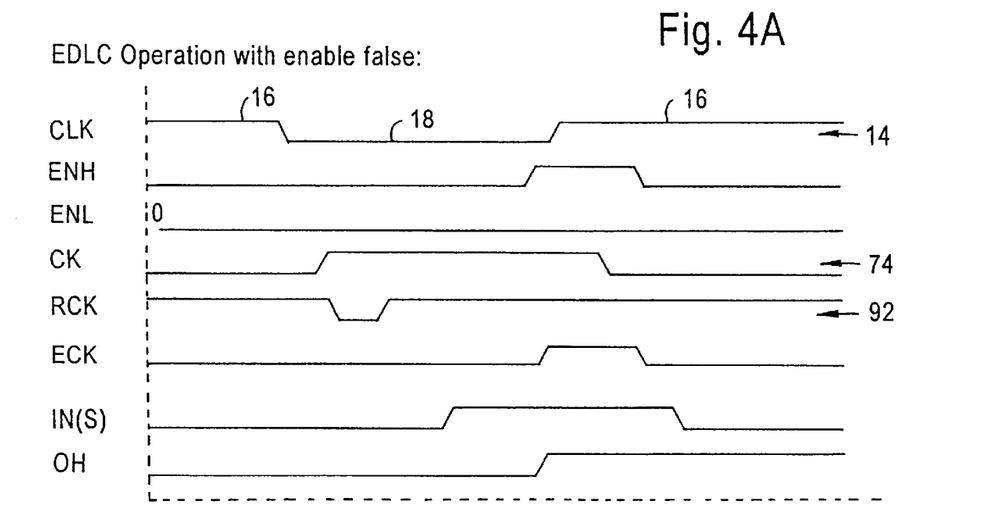
FIG. 4 includes a series of waveforms useful in describing the operation of the circuit of FIG. 3.

Clock source 62 derives CLK wave 14 that is identical with wave 14 clock 12 (FIG. 1) derives. Inverter 72 inverts the CLK wave clock 62 derives to supply CK wave 74 (FIG. 4A) to input terminal 76 of converter circuit 66. Because of the physical separation of the input terminal of chip 60 connected to clock source 62 from terminal 76 and the frequency of source 62, the leading negative going transition of CLK wave 14 occurs somewhat before the leading positive going transition of CK wave 74. The duration of the positive voltage portion of CK wave 74 is same as the low, ground voltage portion of CLK wave 14 during each clock cycle of source 62. In the example of FIG. 4A the leading positive going transition of the ENH signal source 68 derives arrives at terminal 78 of circuit 66 immediately before the positive going trailing edge transition of CLK. In other words, ENH arrives at terminal 78 late in the evaluation portion 18 of CLK, as illustrated in FIG. 4A. The ENL wave remains at a low, binary zero level throughout the clock cycle illustrated in FIG. 4A. Hence, the arrival of the ENL wave at input terminal 80 of circuit 66 is irrelevant for the operation considered in connection with FIG. 4A.

The CK wave at terminal 76 drives inverter 82 and one input terminal of NAND gate 84 in parallel. The output signal of inverter 82 drives a second input terminal of gate 84 via a cascaded arrangement of inverter 86, delay circuit 88 and inverter 90. Gate 84 responds to the waves supplied to the input terminals thereof to derive RCK reset clock wave 92. The RCK wave has a negative going leading edge transition that occurs substantially simultaneously with the positive going leading edge transition of CK wave 74. RCK wave 92 has a positive going trailing edge transition that occurs a few picoseconds (ps) after the leading-edge transition of wave RCK. The separation between the leading and trailing edges of the RCK wave is primarily determined by the delay time of delay circuit 88. RCK reset wave can have any suitable duration such that the leading negative going transition thereof occurs virtually simultaneously with the positive going transition of CK. The trailing positive going transition of RCK must occur before the (1) negative going transition of CK, and (2) the positive going transition of ECK, as described infra in connection with gate 98 and inverter 100.

Gate 84 supplies the RCK reset clock wave in parallel to the gate electrodes of field effect transistors 38 and 92, as well as one input terminal of AND gate 94. The low voltage portion of RCK wave 92 forward biases the source drain path of field effect transistors 38 and 92 to precharge parasitic capacitance 46 and supply a high voltage to the input terminal of the inverter 52. The low voltage portion of RCK wave 92 prevents gate 94 from closing switch 96 which selectively shunts terminal 48 to ground to discharge capacitance 46. As described infra in connection with FIG. 5, three field effect transistors having series connected source drain paths connected in shunt with terminal 48 form gate 94 and switch 96. When all three field effect transistors are forward biased switch 96 is closed to provide a low impedance discharge path for capacitance 46. One of the transistors has its gate electrode responsive to the ENL signal at terminal 80 and has a low source drain impedance only when the ENL signal at terminal 80 has a positive voltage.

NAND gate 98 responds to the ENH signal at terminal 78 and the output of delay circuit 88 to produce an output signal which drives inverter 100. Inverter 100 derives the ECK enable clock which is applied to the gate electrode of field effect transistor 36. ECK has a leading positive going transition that occurs somewhat after the positive going leading-edge transition of the ENH wave at terminal 78. ECK has a negative going transition that occurs (1) a fixed delay after CK falls, or (2) substantially simultaneously with the negative going trailing edge transition of the ENH wave. The leading edge transition of ECK wave occurs late in the positive voltage phase of a cycle of CK.

The remaining input of gate 94 is selectively responsive to the OH output signal of inverter 52 of domino logic gate 64. Pass-through gate 102, including N-channel field effect transistor 104 and P-channel field effect transistor 106, selectively supplies the OH output signal of domino logic gate 64 to lead 108. CK at the input terminal of inverter 82 and its inverted replica at the inverter 82 output respectively drive the gates of field effect transistors 106 and 104 so that when the CK wave at terminal 76 is at a low, ground voltage the pass-through gate is open and the OH output of domino logic gate 64 is applied to lead 108. A positive voltage of CK at terminal 76 prevents opening of pass-through gate 102 so the voltage on lead 108 is isolated from the OH output of domino logic gate 64. When pass-through gate 102 is closed the voltage on lead 108 is latched by virtue of the feedback connections of cascaded inverters 110 and 112 across lead 108. Thereby, the output signal of domino logic gate 64 is applied to lead 108 only during the phase of each clock cycle while CK at terminal 76 has a low voltage level. If domino logic gate 64 has a high output voltage (indicating that the logic function of gate 44 is satisfied by its binary input signals in(s)) during the high level portion of the ECK wave, lead 108 applies a high voltage level to the remaining input terminal of gate 94 throughout the precharge phase and evaluation phase of the next cycle of CLK. If the logic function of logic circuit 44 is not satisfied, causing domino logic gate 64 to derive a low output voltage during the high voltage portion of the ECK wave, lead 108 applies a low voltage to the remaining input terminal of gate 94.

Figure 4B:
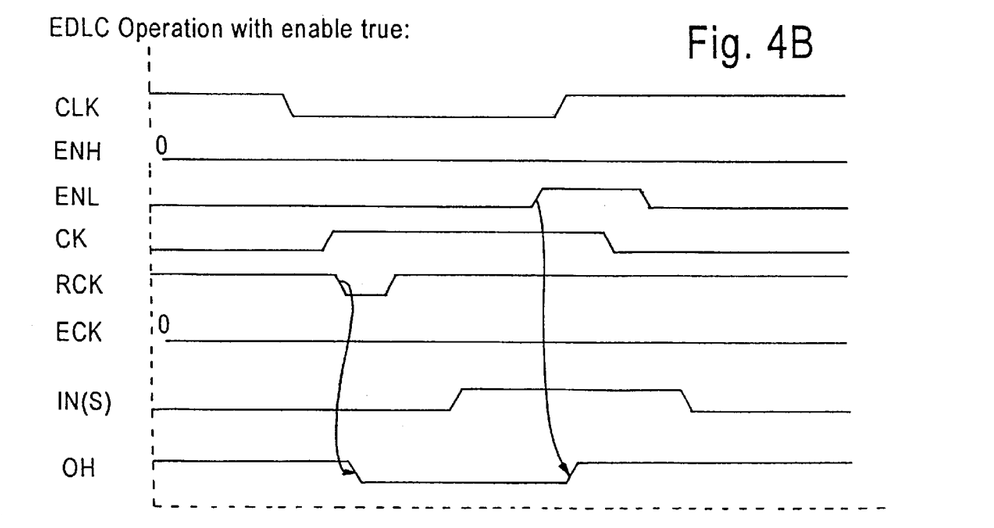

If enable source 70 derives a positive voltage level late in the CLK low voltage evaluate interval 18 while CK is high, as illustrated in FIG. 4B, the output signal of domino logic gate 64 is restored to the value it had during the previous CLK cycle of clock source 62. Under these conditions, the voltage at terminal 78 remains at the low level throughout the CLK cycle. Consequently, inverter 100 supplies a low voltage to the gate of field effect transistor 36 throughout the CLK cycle to prevent discharge of capacitance 46 through the source drain path of field effect transistor 36 during this interval. If the domino logic gate derived a low level in the previous cycle, the voltage on lead 108 is low to disable switch 96. capacitor 46 cannot be discharged through switch 96. Therefore, the voltage across capacitor 46 remains high at its reset (RCK) value. The OH output of domino logic gate 64 remains low which was its value in the previous cycle. If the domino logic gate 64 derived a high level in the previous cycle, lead 108 has a high voltage and switch 96 discharges capacitance 46 causing the domino gate output OH to go high.

Figure 2:
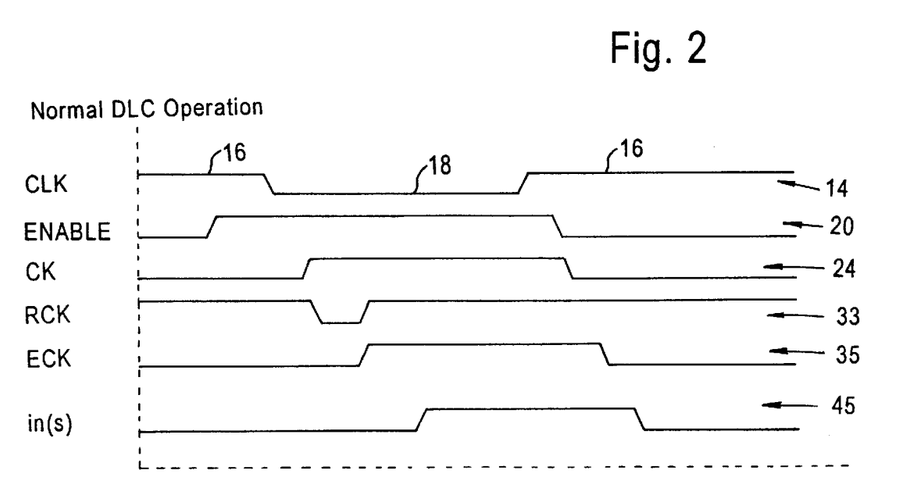
FIG. 2, as described, includes a series of waveforms useful in describing the operation of the prior art circuit of FIG. 1.

A comparison of the waveforms of FIGS. 2 and 4 indicates the ENH and ENL waves can have a positive transition in FIGS. 4A and 4B close to the trailing edge of the CK wave. However, the leading-edge transition of the enable wave of FIG. 2 must occur before the leading edge of the CK wave. The circuit of FIG. 3 allows a mouse trap pair ENH, ENL to arrive late in the evaluate high voltage portion of the CK wave. If ENH of FIG. 3 has a low to high transition late in the evaluate portion of CK, the output signal of inverter 52 is at the logic state determined by the voltage at terminal 48 as determined by logic circuitry 44. If ENL has the low to high transition late in the evaluate portion of CK, the output signal of inverter 52 is restored to its previous state from the last CK clock cycle even though the domino logic circuit has reset or precharged low the output signal of inverter 52 early in the high voltage evaluate portion of the CK wave. Because the circuit of FIG. 3 is enabled by the positive voltage phase of the CK wave, the circuit of FIG. 3 has as much as a phase of CLK to permit logic circuit 44 to control the voltage at terminal 48 provided ENH has a high value. If ENH remains low and, thus, ENL has a high value, the circuit can recover the state of the voltage at terminal 48 as it existed during the previous cycle time of clock source 62. The circuit of FIG. 3 allows normal domino logic gate operation and has advantages, such as recovering past logic state in spite of an early reset. The early reset occurs when RCK has a low value early in the period when CK has a high, binary one value.

While ENH is low, ECK must remain low to cut off field effect transistor 36 so the voltage at terminal 48 is high and not controlled by the logic state at the output terminals of logic circuit 44. ENH and CK must both be high before ECK goes high to enable the voltage at terminal 48 to be at a value determined by the logic state of logic circuit 44. If ENH is high very early in a particular CK cycle, before the high voltage enable portion of CK has propagated through delay circuit 88, ECK stays low so logic circuit 44 does not control the voltage at terminal 48. If ENH is high early in a particular CK cycle, and after the high voltage portion of CK has propagated through delay circuit 88, ECK goes high so logic circuit 44 controls the voltage at terminal 48. Therefore, ECK goes high after RCK goes high. Consequently, the voltage at terminal 48 is determined by the logic state of logic circuit 44 since the binary one or zero value logic circuit 44 derives is coupled to terminal 48 after the source drain path of field effect transistor 36 has been enabled by ECK. This means domino logic gate 64 is enabled to the evaluate state after the domino logic gate has been reset by the low voltage portion of RCK, i.e., after capacitance 46 has been precharged by the current flowing through field effect transistor 38 as a result of RCK being low, if ENH is high early in a CK cycle.

If ENH has a low to high transition late in a CK cycle, ECK has a low to high transition only a few ps later, as determined by the delay times of gate 98 and inverter 100. The ECK positive voltage forward biases field effect transistor 36 to enable the voltage at terminal 48 to be controlled by the logic state of logic circuit 44.

If ENH does not have a low to high transition during a cycle of clock source 62, ENL must have a low to high transition during such a clock cycle to enable the output signal of the previous clock cycle to be restored and then latched at the output terminal of inverter 52. This places the mouse trap pair requirement on ENH and ENL. If ENL has a low to high transition early in a CK cycle, (i.e., when CK has a high voltage value) when RCK forward biases field effect transistor 38 and capacitance 46 is being precharged, the circuit ignores the high value of ENL because the low voltage of RCK prevents gate 94 from closing switch 96. After RCK has a low to high transition to cut off transistor 38 and capacitance 46 cannot be charged through transistor 38 by the positive power supply voltage at terminal 40, a low to high transition of ENL at terminal 80 is recognized by circuit 66.

The output of inverter 52 is latched to the voltage at terminal 48 from the previous cycle of clock source 72 under these conditions in the following manner. The high voltages at terminal 80 and at the output of gate 84 are applied to gate 94. The other input to gate 94 is determined by the output voltage of inverter 52, as it existed during the previous cycle of source 62, in turn controlled by the voltage at terminal 48. If the output voltage of inverter 52 was high during the previous cycle of source 62, a high voltage is on lead 108 and is coupled to the remaining input terminal of AND gate 94. Since all the input signals of gate 94 have a high voltage under these circumstances, the output of gate 94 closes switch 96. Closure of switch 96 grounds terminal 48. The ground voltage at terminal 48 causes inverter 52 to transition low to high thus restoring the previous state. If the voltage at terminal 48 had a positive value during the previous cycle of clock source 62, inverter 52 derives a low voltage (ground) output. Pass gate 102 supplies the ground output voltage of inverter 52 to lead 108 which prevents gate 94 from closing switch 96. Consequently, switch 96 does not ground terminal 48, causing the high voltage at terminal 48 from the RCK reset early during CK high to be maintained and the low voltage output of inverter 52 to be maintained.

Figure 5:
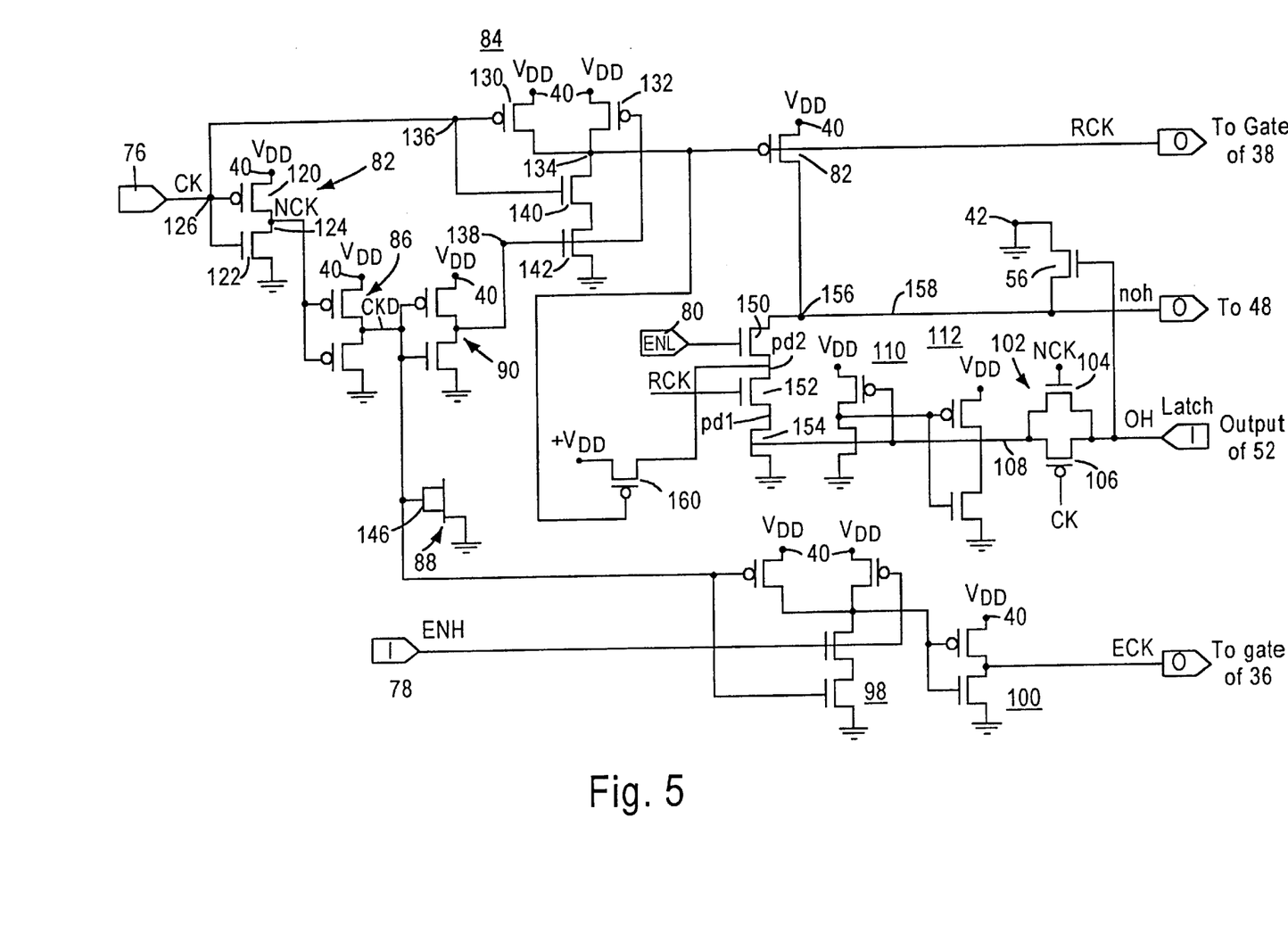
FIG. 5 is a detailed circuit diagram of the preferred embodiment illustrated in FIG. 3.

FIG. 5 is a detailed circuit schematic diagram of the CMOS circuitry of converter circuit 66, FIG. 3. Each of inverters 82, 86, 90, 100, 110 and 112 has substantially the same circuit configuration including a pair of complementary field effect transistors having series connected source paths connected across DC power supply terminals 40 and 42. The gate electrodes of the field effect transistors of each inverter are driven in parallel by the inverter input signal, while the drains of the transistors of each inverter are connected together to derive the inverter output signal. For example, inverter 82 includes P-channel field effect transistor 120 and N-channel field effect transistor 122, the sources of which are respectively connected to the positive DC power supply voltage at terminal 40 and the ground DC power supply terminal 42. The drains of field effect transistors 120 and 122 have a common terminal 124 (the inverter output terminal), while the gate electrodes of the transistors are driven in parallel by the signal applied to terminal 126.

A high-voltage at terminal 126 (i.e., a voltage in the range between approximately 0.5 $V_{DD}$ and $V_{DD}$) forward biases, i.e., turns on, transistor 122 and turns off transistor 120 causing terminal 124 to be substantially at the ground voltage of terminal 42. A low voltage at terminal 126 (i.e., a voltage in the range between ground and approximately one-half of the power supply voltage at terminal 40) forward biases transistor 120 and back biases transistor 122, causing the voltage at terminal 124 to be substantially at the positive power supply voltage of terminal 40. The cross-over voltage of different inverters in the circuit may differ, so that in some of the inverters the N-channel transistor is turned on for a lower range voltage and for other inverters in the circuit, the turn-on voltage of transistor 122 can exceed the mid-point between the voltages between terminals 40 and 42.

Inverters 110 and 112, which latch the voltage on lead 108 (except when transistors 104 and 106 of pass gate 102 are simultaneously biased on by the voltages at the input and output terminals of inverter 82) are arranged to provide the cascaded connections illustrated in FIG. 3. In particular, the gates of the field effect transistors in inverter 110 are connected to lead 108, while the drains of the transistors of inverter 110 are connected to the gate electrode of inverter 112. The drains of inverter 112 are connected directly to lead 108 to provide the latching action. The construction of the transistors in latches 110 and 112 is such that the feedback action thereof is overcome when pass gate 102 is opened by virtue of transistors 104 and 106 being turned on by NCK and CK at the gate electrodes thereof being at a positive voltage and ground.

NAND gates 84 and 98 are substantially the same and have the same circuit configuration so that the description of gate 84 suffices for gate 98. Gate 84 includes P-channel transistors 13C) and 132 having the source drain paths thereof connected in parallel so that the sources of transistors 130 and 132 are connected to positive DC power supply terminal 40, while the drains of these transistors have a common connection to terminal 134 which functions as an output terminal of gate 84. The gate electrodes of transistors 130 and 132 are respectively responsive to the bi-level voltages at terminals 136 and 138 which function as the input terminals of gate 84. N-channel field effect transistors 140 and 142 have series connected source drain paths connected between terminal 134 and ground power supply terminal 42. The voltages at terminals 136 and 138 respectively drive the gate electrodes of transistors 140 and 142.

In response to the voltages at both input terminals 136 and 138 of NAND gate 84 having a low value, the source drain paths of transistors 130 and 132 are both forward biased and the source drain paths of transistors 140 and 142 are both back biased. Accordingly, current flows through both of transistors 130 and 132 from positive power supply terminal 40 to terminal 134 and virtually no current flows from terminal 134 to ground, so that terminal 134 is substantially at the positive power supply terminal voltage +$V_{DD}$ at terminal 40.

In response to the voltages at terminals 136 and 138 being respectively high and low, transistors 130 and 132 are respectively back and forward biased while transistors 140 and 142 are respectively forward and back biased. Current thus flows from positive power supply terminal 40 through the source drain path of transistor 132 to terminal 134 and virtually no current flows from terminal 134 to ground terminal 42. Consequently, the voltage at terminal 134 is again substantially equal to the positive power supply voltage +$V_{DD}$ at terminal 40.

In response to the voltages at terminals 136 and 138 being respectively low and high, transistors 130 and 132 are respectively forward and back biased, while transistors 140 and 142 are respectively back and forward biased. Consequently, current flows from power supply terminal 40 through the source drain path of transistor 130 but no substantial current flows from terminal 134 to ground through transistors 140 and 142. As a result, the voltage at terminal 134 is again substantially equal to the positive DC power supply voltage +$V_{DD}$ at terminal 40.

In response to the voltages at terminals 136 and 138 both being high, both of transistors 130 and 132 are back biased and both of transistors 140 and 142 are forward biased. Consequently, no current flows through the source drain paths of transistors 130 or 132 to terminal 134, but a low impedance path subsists between terminal 134 and ground power supply terminal 42. As a result, terminal 134 is decoupled from positive power supply terminal 40 but is tied substantially to the low voltage, ground potential of terminal 42.

Based on the foregoing the voltage at terminal 134 is low only when the voltages at terminals 136 and 138 are both high. If the voltage at one or both of terminals 136 or 138 is low the voltage at terminal 134 is high. Consequently, the stated configuration of transistors 130, 132, 140 and 142 satisfies the Boolean NAND function requirements.

Delay element 88 is effectively a resistance capacitance (RC) low pass filter formed by N-channel field effect transistor 146. The gate electrode of field effect transistor 146 is tied to a common terminal at the output of inverter 86 and the input of inverter 90, i.e., the gate electrode of field effect transistor 146 has a direct connection to the drains at the output terminal of inverter 86 and the gate electrodes at the input terminal of inverter 90. The source and drain electrodes of field effect transistor 146 are short circuited to each other and to ground to provide a capacitive connection from the gate electrode of field effect transistor 146 to ground. Field effect transistor 146 has a relatively long and wide gate region, i.e., an oxide layer between the gate electrode and the source and drain electrodes of transistor 146 is relatively long and wide. Such a construction of field effect transistor 146 enables the transistor to have a relatively high capacitance. Thereby, field effect transistor 146 in conjunction with the output resistance of inverter 86 provides a relatively long resistance-capacitance time constant so the leading and trailing edges of pulses inverter 86 supplies to NAND gate 98 are delayed by several picoseconds, as discussed above.

As mentioned previously, AND gate 94 and switch 96 are formed by three transistors having series connected source drain paths. In particular, the combination of gate 94 and switch 96 includes N-channel transistors 150, 152 and 154, having source drain paths series connected between terminal 156 and ground power supply terminal 42. Terminal 156 is connected to terminal 48 of domino logic gate 64 (FIG. 3) and thus to the input terminal of inverter 52 by lead 158, which serves as an output lead of converter circuit 66. The source drain path of transistor 56 is connected between lead 158 and ground so that transistor 56, which is part of the latching circuitry for inverter 52 at the output of the domino logic gate, is physically part of converter circuit 66. The gate electrodes of transistors 150, 152 and 154 are respectively connected to be responsive to the ENL input signal at terminal 80, the RCK output signal NAND gate 84 supplies to terminal 134, and the signal on lead 108. In response to the signals at the gate electrodes at each of transistors 150, 152 and 154 having a high voltage level, the source drain paths of these three transistors are forward biased to connect lead 158 and terminal 48 to ground terminal 42. Thereby, the input signal to inverter 52 is maintained at a low voltage value under these circumstances.

To positively assure that the voltage at terminal 156 has the low voltage at terminal 48 only when the voltages at the gate electrodes of all of transistors 150, 152 and 154 have a high value, the common connection between the source and drain electrodes of transistors 150 and 152 is selectively coupled to the positive DC power supply voltage at terminal 40 by the source drain path of P-channel field effect transistor 160. The gate electrode of transistor 160 is responsive to the RCK wave NAND gate 84 develops at terminal 134, while the source drain path of transistor 160 is connected between the common terminal between transistors 150 and 152 and the positive power supply voltage terminal 40.

The RCK wave has a high value for the vast majority of the time during each cycle of clock source 62. During the interval while the RCK voltage is high, the source drain path of transistor 160 decouples the high positive voltage at power supply terminal 40 from the common connection of the source and drain electrodes of transistors 150 and 152. However, a "fault", low voltage may have a tendency to be developed at terminal 156. If terminal 108 is low and transistors 150 and 152 are on, capacitance 46 should not be discharged. Source and drain capacitance at nodes pd1 and pd2 may be at a low voltage. The low voltage at either of nodes pd1 or pd2 when coupled to capacitance 46 through transistor, 150 and 152 could cause a charge sharing condition, resulting in a charge redistribution. This charge redistribution may lower the voltage on lead 158. The low voltage on lead 158 can be incorrectly interpreted as a low binary zero value. Transistor 160 precharges a source drain parasitic capacitance (not shown) at node pd2 to mitigate the charge redistribution to positively prevent the voltage on lead 158 from drooping to such an extent as to be interpreted as a binary zero value. Hence, transistor 160 and its connections enhance the reliability of the operation of transistors 150, 152 and 154 forming gate 94 and switch 96.

While there have been described and illustrated one specific embodiment of the invention, it will be clear that variations in the details of the embodiment specifically illustrated and described may be made without departing from the true spirit and scope of the invention as defined in the appended claims. For example, the CK waves of FIGS. 4A and 4B have high and low values during the evaluation and precharge phases respectively. Alternatively, inverted replicas (referred to as NCK) of the CK waves can be used, in which case the evaluation and precharge phases are respectively associated with high and low values of NCK. Hence the terms evaluation and precharge, when used in the accompanying claims, are not necessarily associated with high and low voltages of CLK.

We claim:

1. An integrated circuit that resides on a chip adapted to be responsive to a clock source comprising a domino logic gate, circuitry connected to be responsive to the clock source for selectively latching a logic output signal of the gate, and an enable source for the gate; a clock wave of the clock source that is supplied to the circuitry and the clock frequency being such that the enable signal arrives at the logic gate late in an evaluation clock phase, the circuitry for selectively latching being constructed so that the domino logic gate is evaluated or restored to its value from the previous cycle, then latched during the same clock cycle that the enable signal is derived.

2. An integrated circuit chip adapted to be responsive to a clock wave source, comprising a domino logic gate located on a first segment of the chip and including precharge and evaluate circuitry, circuitry connected to be responsive to the clock source for selectively latching a logic output signal of the domino logic gate and for selectively enabling the precharge and evaluate circuitry of the domino logic gate to operate in a normal mode so that the domino logic gate is precharged during a first part of a clock evaluation phase and an output signal of the domino logic gate is evaluated during a second part of the clock evaluation phase, the circuitry for selectively latching and enabling being on the first segment of the chip, an enable source for commanding normal operation of the domino logic gate, the enable source being on a second segment of the chip, the second segment being at a location relative to the first segment and the clock source having a frequency for operating the domino logic gate such that the signal from the enable source arrives at the first segment of the chip after the first part of the clock evaluation phase has elapsed, the circuitry for selectively latching and enabling responding to the clock wave and the enable signal for causing the domino logic circuit to operate normally when the enable signal has a value associated with enabling the circuit for selectively latching and enabling during a clock wave cycle and for causing the domino logic circuit output signal to be restored and latched to the value it had prior to the current clock cycle when the enable signal has a value associated with disabling the circuitry for selectively latching and enabling during a clock cycle.

3. The integrated circuit chip of claim 2 wherein the circuitry for selectively latching and enabling includes logic circuitry responsive to a delayed replica of the clock wave as supplied to the first segment of the chip and the enable signal as supplied to the first segment for deriving an evaluate signal during the evaluation phase of the clock cycle and for supplying the derived evaluate signal to the domino logic gate after the first part of the clock evaluation phase has elapsed.

4. The integrated circuit chip of claim 3 wherein the enable signal includes first and second components, the first component having a first binary value associated with enabling the circuitry for selectively latching and enabling the domino logic gate, the second component having a first binary value associated with disabling the circuitry for selectively latching and enabling the domino logic gate, the circuitry for selectively latching and enabling including logic circuitry responsive (1) to the first binary value of the first component and the clock wave for enabling the evaluate circuitry and for thereafter latching the output signal of the domino gate to the signal value which resulted from the evaluation, and (2) to the first binary value of the second component, the output signal of the domino logic circuit and the clock wave for restoring and latching the domino logic circuit output signal to its value from the previous cycle.

5. The integrated circuit chip of any of claim 4 wherein the logic circuit includes:
   delay circuitry responsive to the clock wave for deriving a reset wave having a first binary value during the first portion of the clock evaluation phase for precharging of the domino logic circuitry,
   a switch, the switch being connected in shunt with a capacitance of the domino logic circuit that is precharged during the first part of the clock evaluation phase and is selectively discharged during the second part of the clock evaluation phase, the switch being arranged for discharging the capacitance while (a) the reset wave has a second binary value, (b) the second enable component has the first binary value and (c) the domino logic circuit output previously had a first predetermined value for a period including the most recent precharge interval and at least one of the most recent evaluate intervals and the period between them, the switch being arranged to be open while (a) the reset wave has the first binary value or (b) the second enable component has a second binary value, or (c) the domino logic circuit has a second predetermined value for the period including the most recent precharge interval, the capacitance being connected to an input of an inverter which derives the domino logic circuit output, and latching circuitry for coupling the output of the inverter back to the input of the inverter.

6. The integrated circuit chip of claim 5 wherein a portion of the logic circuitry includes a pass gate connected to be responsive to the domino gate output, the pass gate being responsive to the clock wave as coupled to the first segment of the chip for coupling the domino gate output to a terminal for the period including the most recent precharge interval, a regenerative latching circuit connected to the terminal for maintaining the voltage at the terminal substantially constant between adjacent occurrences of the precharge interval, the switch being connected to be responsive to the voltage at the terminal.

7. The integrated circuit chip of claim 6 wherein the logic circuitry is arranged to supply a charging voltage to the capacitance during the first part of the clock evaluation phase.

8. The integrated circuit chip of claim 7 wherein the switch includes first, second and third field effect transistors of the same first conductivity type having source drain paths series connected between one DC power supply terminal of the chip and the capacitance of the domino logic gate, the first, second and third transistors having gate electrodes respectively responsive to (a) the voltage at the terminal, (b) a shaped version of the clock wave causing back biasing of the gate of the second transistor during the first part of the clock evaluation phase, and (c) the second enable component, a fourth field effect transistor of a second conductivity type opposite to the first conductivity type having a source drain path connected between another DC power supply terminal of the chip and a terminal between the source drain paths of the second and third transistors, the fourth transistor having a gate electrode connected to be responsive to the shaped version of the clock wave so that the fourth transistor supplies current to the terminal between the source drain paths of the second and third transistors during the first portion of the clock cycles to prevent establishment of a charge share path for the capacitance through the first and second transistors during the clock evaluation phase.

9. The integrated circuit chip of claims 8 wherein the circuitry is complementary metal oxide semiconductor circuitry including plural P-channel and N-channel field effect transistors.

10. The integrated circuit chip of claim 2 wherein the logic circuit includes:
    delay circuitry responsive to the clock wave for deriving a reset wave having a first binary value during the first part of the clock evaluation phase for precharging of the domino logic circuitry,
    a switch, the switch being connected in shunt with a capacitance of the domino logic circuit that is precharged during the first part of the clock evaluation phase and is selectively discharged during the second part of the clock evaluation phase, the switch being arranged for discharging the capacitance while (a) the reset wave has a second binary value, (b) the second enable component has the first binary value and (c) the domino logic circuit output previously had a first predetermined value for a period including the most recent precharge interval and at least one of the most recent evaluate intervals and the period between them, the switch being arranged to be open while (a) the reset wave has the first binary value or (b) the second enable component has a second binary value, or (c) the domino logic circuit has a second predetermined value for the period including the most recent precharge interval, the capacitance being connected to an input of an inverter which derives the domino logic circuit output, and latching circuitry for coupling the output of the inverter back to the input of the inverter.

11. The integrated circuit chip of claim 2 wherein a portion of the logic circuitry includes a pass gate connected to be responsive to the domino gate output, the pass gate being responsive to the clock wave as coupled to the first segment of the chip for coupling the domino gate output to a terminal for the period including the most recent precharge interval, a regenerative latching circuit connected to the terminal for maintaining the voltage at the terminal substantially constant between adjacent occurrences of the precharge interval, the switch being connected to be responsive to the voltage at the terminal.

12. The integrated circuit chip of claim 11 wherein the logic circuitry is arranged to supply a charging voltage to the capacitance during the first part of the clock evaluation phase.

13. The integrated circuit chip of claim 12 wherein the switch includes first, second and third field effect transistors of the same first conductivity type having source drain paths series connected between one DC power supply terminal of the chip and the capacitance of the domino logic gate, the first, second and third transistors having gate electrodes respectively responsive to (a) the voltage at the terminal, (b) a shaped version of the clock wave causing back biasing of the gate of the second transistor during the first part of the clock evaluation phase, and (c) the second enable component, a fourth field effect transistor of a second conductivity type opposite to the first conductivity type having a source drain path connected between another DC power supply terminal of the chip and a terminal between the source drain paths of the second and third transistors, the fourth transistor having a gate electrode connected to be responsive to the shaped version of the clock wave so that the fourth transistor supplies current to the terminal between the source drain paths of the second and third transistors during the first portion of the clock cycles to prevent establishment of a charge share path for the capacitance through the first and second transistors during the clock evaluation phase.

* * * * *